U.S. Patent Number: 5,781,448
Date of Patent: Jul. 14, 1998

[54] CONTROL SYSTEM AND CONTROL METHOD FOR UNINTERRUPTIBLE POWER SUPPLY

[75] Inventors: Yoichi Nakamura; Takashi Saito, both of Kanagawa, Japan; Phil Coldwell; Nigel Hart, both of Birmingham, United Kingdom

[73] Assignees: Mitsubishi Denki Kabushiki Kaisha, Tokyo, Japan; Apricot Computers Limited, Birmingham, England

[21] Appl. No.: 556,807

[22] Filed: Nov. 2, 1995

[30] Foreign Application Priority Data

Aug. 2, 1995 [GB] United Kingdom ............ 9515864

[51] Int. Cl.[6] ...................... G06F 1/26; H02J 9/06
[52] U.S. Cl. .............. 364/492; 364/483; 364/550; 395/750; 395/182.2; 395/182.22; 340/635; 340/636; 320/48; 307/64; 307/66
[58] Field of Search ............... 364/481, 483, 364/492, 550; 340/635, 636; 320/2, 5, 30, 48; 324/426, 427; 307/64, 66; 395/750, 182.2, 182.22

[56] References Cited

U.S. PATENT DOCUMENTS

| | | |
|---|---|---|
| 5,148,043 | 9/1992 | Hirata et al. ............ 307/66 |
| 5,287,286 | 2/1994 | Ninomiya ............ 364/481 |
| 5,295,078 | 3/1994 | Stich et al. ............ 364/483 |
| 5,341,084 | 8/1994 | Gotoh et al. ............ 320/44 |
| 5,434,495 | 7/1995 | Toko ............ 320/44 |
| 5,434,508 | 7/1995 | Ishida ............ 324/427 |
| 5,545,969 | 8/1996 | Hasegawa ............ 320/5 |
| 5,587,924 | 12/1996 | Rossi ............ 364/496 |
| 5,598,087 | 1/1997 | Hara ............ 320/48 |

FOREIGN PATENT DOCUMENTS

| | | |
|---|---|---|
| 0385774 | 9/1990 | European Pat. Off. |
| 1-143984 | 6/1989 | Japan. |
| 2-181210 | 7/1990 | Japan. |
| 07085891 | 9/1993 | Japan. |
| 07020215 | 1/1995 | Japan. |
| 2208192 | 3/1989 | United Kingdom. |
| PCT91/07796 | 5/1991 | WIPO. |

OTHER PUBLICATIONS

German Official action from German Patent Application 196 20 160.8–34, filed Nov. 15, 1996.
Translation of German Official Action from German Patent Application 196 20 160.8–34, filed Nov. 15, 1996.
Patent Abstracts of Japan, Jan. 24, 1995, JP–A–07020215 Hitachi Ltd.
Patent Abstracts of Japan, Jul. 16, 1990, JP–A–2–181210 Hitachi Ltd.
Patent Abstracts of Japan, Jun. 6, 1989, JP–A–1–143984 Aisin AW Co. Ltd.
Patent Abstracts of Japan, Sep. 17, 1986, JP–A–61–209372 Matsushita Electric Works Ltd.
Patent Abstracts of Japan, May 14, 1992, JP–A–4–140678 Seiko Epson Corp.
Patent Abstracts of Japan, Dec. 17, 1993, JP–A–5–333119 Matsushita Electric Inc. Co. Ltd.
Patent Abstracts of Japan, Oct. 10, 1991, JP–A–3–239125 NEC Corp.
Patent Abstracts of Japan, Dec. 17, 1993, JP–A–5–333974 Sanyo Electric Co. Ltd.

*Primary Examiner*—James P. Trammell
*Assistant Examiner*—Tuan Q. Dam
*Attorney, Agent, or Firm*—Wolf, Greenfield & Sacks, P.C.

[57] ABSTRACT

Amount of alternating current power is calculated using measuring units for alternating current voltage and alternating current. Value of direct current is calculated using the calculated alternating current power and an efficiency table. An initial life time of a battery is predicted using the calculated direct current value and a battery life time table. Life time corresponding to an actual consumed amount is repeatedly updated using a detected direct current value and an updated life time.

21 Claims, 21 Drawing Sheets

Fig.6

DIGITAL CONTROL SIGNAL TABLE

| SIGNAL | UPS I/O | TRUE | | FALSE | |
|---|---|---|---|---|---|
| | | LEVEL | MEANING | LEVEL | MEANING |
| POWER UP | INPUT | 0 | STANDBY: GO TO POWER ON (ACKNOWLEDGE: DC GOOD = TRUE) | 1 | NO ACTION |
| SHUTDOWN | INPUT | 0 | POWER ON: GO TO STANDBY (ACKNOWLEDGE: DC GOOD = FALSE) BACKUP, GO TO POWER OFF (ACKNOWLEDGE: DC GOOD = FALSE) | 1 | NO ACTION |
| AC GOOD | OUTPUT | 1 | AC INPUT IS SUITABLE AND THE PSU IS POWERED ENTIRELY BY AC | 0 | AC INPUT OUT OF SPEC. PSU MAY DRAW BATTERY CURRENT |
| DC GOOD | OUTPUT | 1 | DC OUTPUTS 0-2,3 AND 4 ARE WITHIN SPEC. | 0 | ONE OR MORE ARE NOT WITHIN SPEC |
| CIRCUIT BREAKER SENSE | OUTPUT | 1 | CIRCUIT BREAKER IS CLOSED, SO BATTERIES MAY SUPPLY DC POWER | 0 | CIRCUIT BREAKER IS OPEN, SO BATTERIES CANNOT SUPPLY DC POWER |
| THERMAL ALARM | OUTPUT | 0 | PSU COOLING FAILURE | 1 | TEMPERATURE OK |

Fig.7

ANALOG CONTROL SIGNAL TABLE

| SIGNAL 511 | UPS I/O 512 | MEANING 513 |
|---|---|---|
| DCO-2 MONITOR | OUTPUT | DELETED |
| AC VOLTS | OUTPUT | INDICATES RMS VALUE OF THE SINUSOIDAL VOLTAGE ON IEC 320 C 20 INLET CONNECTOR |
| AC CURRENT MONITOR | OUTPUT | INDICATES RMS VALUE OF CURRENT DRAWN FROM THE AC SUPPLY |
| DC CURRENT MONITOR | OUTPUT | INDICATES THE AVERAGE CURRENT DRAWN FROM THE LEAD-ACID BATTERIES |
| BATTERY VOLTAGE MONITOR | OUTPUT | INDICATES LEAD-ACID BATTERY VOLTAGE |

Fig.8

| UPS MODE TRUTH TABLE 520 | 521 | 522 |
|---|---|---|
| STATE | AC GOOD | DC GOOD |
| DEAD | DON'T CARE | DON'T CARE |
| POWER OFF | FALSE | FALSE |
| STANDBY | TRUE | FALSE |
| POWER ON | TRUE | TRUE |
| BACKUP | FALSE | TRUE |

Fig.10

DISPLAY FOR UPS STATE

| OPE. STATE | OPE. LUMP | WARNING | MEANING |
|---|---|---|---|
| NORMAL | GREEN | NOTHING | NORMAL OPE. (BAT. FULLY CHARGED) |
|  | GR. FLICKER |  | NORMAL OPE. BAT. ON CHARGE |
| PHASE 1 | RED | LOW SOUND | OPE. BY BATTERY |
| PHASE 2 |  | HIGHER THAN PH.1 |  |
| PHASE 3 | RED FLI. | HIGHER THAN PH.2 | BAT. CAPACITY IS LITTLE |
| POWER SHUT DOWN | OFF | NOTHING | BAT. CAPACITY IS ZERO. OR POWER SWITCH OFF |

Fig.21
RELATED ART

| OPERATION STATE | ALARM SOUND | OPERATION LUMP |
|---|---|---|
| NORMAL | NO SOUND | GREEN |
| PHASE 1 | SLOW, HIGH | RED |
| PHASE 2 | REPEAT HIGH&LOW | RED |
| PHASE 3 | FROM HIGH TO LOW | RED FLICKER |

CONTROL SYSTEM AND CONTROL METHOD FOR UNINTERRUPTIBLE POWER SUPPLY

BACKGROUND OF THE INVENTION

1. Field of the Invention

This invention relates to a system and a method for controlling an uninterruptible power supply (UPS). Particularly, it relates to a control system for stopping a system safely by accurately predicting a life time of a battery in the case of the system being operated by the battery of the UPS.

2. Description of the Related Art

FIG. 19 is a block diagram showing "Residual Charging Capacity Detecting Apparatus for a Secondary Battery" disclosed in the Unexamined Japanese Patent Publication 7-20215.

In this related art, a battery 101 fully charged is discharged and its discharging time is measured at every operation state of an apparatus. It is defined that a value obtained by dividing battery charging capacity by the discharging time is a predicted discharging speed 1, 2, 3, .... The discharging speeds are stored in a memory 120 in advance. Operation states used for measuring the discharging speed are normal operation state, suspend state, backlight on state, backlight off state and so on. The kinds of the operation state are limited and defined permanently.

When an abnormal condition, such as power failure of the alternating current, is generated and power from the battery is provided to the apparatus, power consumption can be calculated by using one of the predicted discharging speeds 1, 2, 3, ... stored in the memory 120 in advance based on the operation state of the apparatus, without measuring an amount of direct current.

In "Information Processing Apparatus" disclosed in the Unexamined Japanese Patent Publication 2-181210, a technique for calculating a consumption amount of a battery and residual charging capacity of the battery is disclosed. The consumption amount of the battery is calculated based on an average usage current amount and a usage time needed for executing a designated process. The residual charging capacity of the battery is calculated based on charging capacity and consumption amount. "Battery State Monitoring Apparatus" disclosed in the Unexamined Japanese Patent Publication 1-143984 has the followings. A voltage measuring unit measures a voltage between terminals of the battery. A current measuring unit measures an amount of current used for charging and discharging of the battery. A temperature measuring unit measures a temperature of the battery. A calculation unit inputs values measured by the voltage measuring unit, current measuring unit and temperature measuring unit, and calculates residual charging capacity of the battery. A display device displays the residual charging capacity calculated at the calculation unit.

"Recognition Circuit for Battery Residual Charging Capacity" in the Unexamined Japanese Patent Publication 61-209372 discloses the following technique. Current for charging and discharging of the battery is detected and a peripheral temperature is detected by a temperature transducer. Charging rate and discharging rate are calculated using the detected current for charging and discharging and the detected peripheral temperature. Then, residual charging capacity of the battery is corrected using the above rates.

Apparatus and method for detecting residual charging capacity of the battery is also disclosed in the Unexamined Japanese Patent Publications 4-140678, 5-333119, 3-239125 and 5-333974.

FIG. 20 shows a state transition of the related UPS at service interruption by power failure of the alternating current. The UPS provides power from an alternating current power supply (commercial power supply) and includes an internal battery. When an abnormal condition happens in providing the power from the alternating current power supply, the UPS provides power needed for operating the apparatus, from the internal battery. The internal battery in the UPS is charged by the alternating current power supply during the apparatus operation. As power is provided from the battery to the apparatus at the service interruption of the alternating current power supply by using the UPS, continuous operation can be performed safely in the apparatus and safe stopping of the apparatus can be also performed.

When service interruption is generated, a process consisted of three phases is performed, as shown in FIG. 20. The UPS normally provides power from the alternating current power supply at a step S100. If service interruption is generated at this state, a process of phase 1 is performed as shown in a step S101. The process of phase 1 is performed during the first fifteen seconds at the service interruption. The operation is switched from using the alternating current power supply to using the battery at the generation of the service interruption. If the service interruption is returned to the normal condition during the fifteen seconds, the operation by the alternating current power supply is restarted.

If the service interruption is not returned to the normal condition during the fifteen seconds, the process goes to a phase 2 at a step S102. The operation by the battery is continued by the process of phase 2. A warning is given for the user at the phase 2 starting. When the internal battery is charged fully, it is possible to supply the power for at most twenty-five minutes, for instance. However, the possible time of supplying the power depends upon the amounts and kinds of memories and peripheral devices included in the apparatus.

When the residual charging capacity of the battery becomes little, the process goes to a phase 3 as shown at a step S103. The phase 3 process gives warning to the outside that the residual charging capacity of the battery becomes little, and performs stopping operation of the apparatus at once. Time of the phase 3 lasts for several minutes. However, processing time of the phase 3 changes depending upon a consumption state of the battery. When the process of the phase 3 is finished, the system stops as shown in a step S104. In addition, the UPS itself stops to prevent an over discharge from the battery.

The warning is given to the user based on the state of the UPS as shown in FIG. 21. The warning is consisted of an alarm and an operation lamp. The user of the system can understand the state of the UPS because alarms and operation lamps corresponding to each phase are displayed. The user of the system performs preparing operation for the system stopping, such as saving files, finishing an application program, and performing log-out from the network, based on the outputted warning.

In Related Art, the power consumption is calculated using a measured discharging speed. In this case, it is only possible to calculate the power consumption at a fixed and simple operation state. It is not possible to calculate the power consumption corresponding to a complicated operation state. It is also impossible to deal with a configuration change of the electronic system and with a system wherein the power consumption is changed continuously according as the time passes.

In addition, it is only possible to infer residual charging capacity of the battery. Means for inferring a continuation time of the system, which the user of the electronic system really want to know, has not been provided. In fact, there is a case that the number of CPU (central processing unit), memory amount and the number of disks, which are included in a server used for a server client system, can be flexibly changed. Relating to operating software, a high level OS (operating system) is used and a large scale application software, such as data base software, is operated. There are many cases as stated above, it is necessary to accurately predict the continuation time of the system operated by the battery even when the hardware configuration of the system is changed or the power consumption is changed according as the time passes depending upon the operating software.

In Related Art, even in the case that the continuation time of the system is predicted, means for stopping the system safely using the predicted continuation time has not been provided. For example, as stated in the explanation about the state transition of the UPS at the service interruption with reference to FIG. 20, processing time for the phase 2 or 3 is changed depending upon the system configuration and residual charging capacity of the battery. Therefore, there has been a case that enough time needed for stopping the system safely is not ensured. In predicting the continuation time, the method of obtaining the continuation time by dividing battery residual charging capacity by power consumption is confusing for the user. The reason is that the power consumption increases and decreases according as the time passes, then the continuation time also increases and decreases, which makes it impossible to stop the system safely. For example, the continuation time predicted to be three minutes first can be ten minutes suddenly and then rapidly changed to be one minute. In this situation, it is impossible for the system to determine whether just a warning should be made or an actual stopping process should be started. In fact, there is a case that when the system starts preparation for stopping based on service interruption information toward OS and an application program, most of disk devices and memories are used enormously, which brings about a large increase of the power consumption. It is necessary to stop the system safely even in such a case.

SUMMARY OF THE INVENTION

In order to solve the above-mentioned problems, it is an object of the present invention to provide an uninterruptible power supply (UPS) which can predict a life time of a battery accurately based on an inferred power consumption corresponding to any system configuration.

It is another object to provide the UPS which can precisely predict a possible operation time of the system operated by the battery even when operation state is not fixed and power consumption changes continuously and momentarily.

It is another object to provide the UPS which can stop the system safely based on predicted possible operation time.

According to one aspect of the present invention, a control system for uninterruptible power supply comprises (a) an uninterruptible power supply including a battery for supplying direct current (DC), for inputting alternating current (AC) from an alternating current power supply, converting the alternating current into direct current and outputting the direct current from one of the alternating current power supply and the battery (b) an electronic system operated by inputting the direct current output from the uninterruptible power supply, and (c) a controller for calculating a value of power consumption of the electronic system while the electronic system is operated by the direct current produced from the alternating current power supply, for calculating a life time of the battery based on residual charging capacity of the battery and the value of power consumption, when the electronic system starts operation by power from the battery, and for outputting the life time to the electronic system.

According to another aspect of the present invention, a control system for uninterruptible power supply comprises (a) an uninterruptible power supply including a battery for supplying direct current, for inputting alternating current from an alternating current power supply, converting the alternating current into direct current and outputting the direct current from one of the alternating current power supply and the battery (b) an electronic system operated by inputting the direct current output from the uninterruptible power supply, and (c) a controller for calculating a life time of the battery based on residual charging capacity of the battery and a value of direct current from the battery, while the electronic system is operated by power from the battery, and for outputting the life time to the electronic system.

According to another aspect of the present invention, a control method for uninterruptible power supply, used for an electronic system operated by uninterruptible power supply, comprises the steps of (a) operating the electronic system by an alternating current power supply at an ordinary time (b) measuring power consumption during the electronic system operated by the alternating current power supply, in the operating step at an ordinary time (c) operating the electronic system by a battery at an extraordinary time (d) predicting a life time of the battery based on residual charging capacity of the battery and the power consumption measured by the power consumption measuring step, at a starting time of the operating step at an extraordinary time, and (e) controlling operation of the electronic system based on the life time of the battery predicted by the predicting step.

According to another aspect of the present invention, a control method for uninterruptible power supply, used for an electronic system operated by uninterruptible power supply, comprises the steps of (a) operating the electronic system by an alternating current power supply at an ordinary time (b) operating the electronic system by a battery at an extraordinary time (c) periodically detecting residual charging capacity of the battery and an average value of direct current from the battery at a specific period while the electronic system is operated by the battery, in the operating step at an extraordinary time, and predicting and updating a life time of the battery based on the average value of the residual charging capacity of the battery and the direct current from the battery, and (d) controlling operation of the electronic system based on the life time of the battery predicted by the predicting and updating step.

Other objects, features and advantages of the invention will be apparent from the following description when taken in conjunction with the accompanying drawings.

BRIEF DESCRIPTION OF THE DRAWINGS

FIG. 6 shows a table for digital control signal according to an embodiment of the present invention;

FIG. 7 shows a table for analog control signal according to the embodiment of the present invention;

FIG. 8 shows a table for UPS mode truth table according to the embodiment of the present invention;

FIG. 10 shows a display for UPS state transition at a service interruption, according to the present invention;

FIG. 21 shows a display for state transition of UPS at a service interruption in Related Art.

DESCRIPTION OF THE PREFERRED EMBODIMENT

Figure 1:
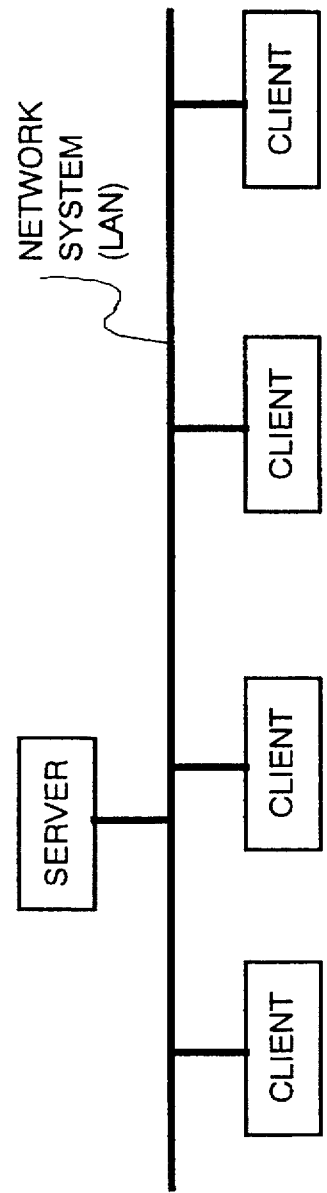
FIG. 1 shows an example of UPS of the present invention.

FIG. 1 shows a configuration of a system of an embodiment of the present invention. A network system (or local area network) 3000 of this embodiment is a server client system including a server 1000 and a plurality of clients 2000.

Figure 2:
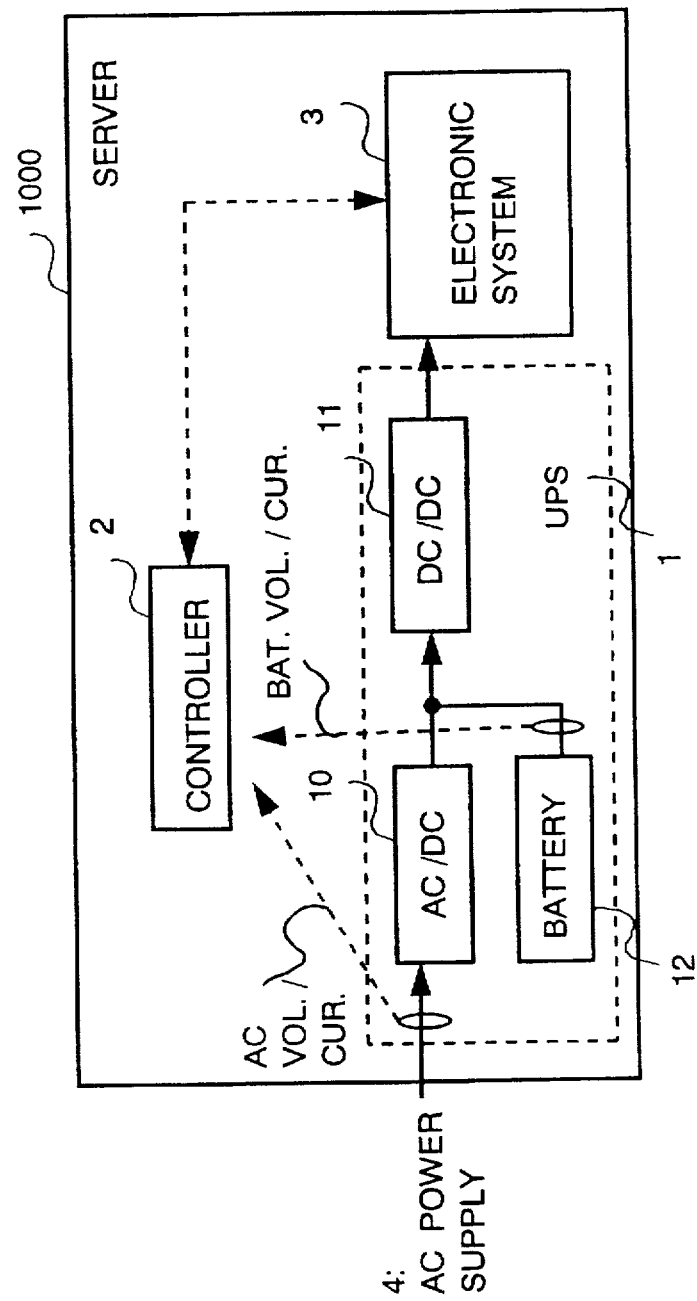
FIG. 2 shows a block diagram of UPS system of the present invention.

FIG. 2 shows a configuration of the server 1000. An uninterruptible power supply (UPS) 1, a controller 2 and an electronic system 3 are provided in the server 1000. The electronic system 3 may be a computer system, a measuring system, a working system, and any other system. A converter for alternating current to direct current (AC/DC converter) 10, a converter for direct current to direct current (DC/DC converter) 11 and a battery 12 are included in the UPS 1. The controller 2 inputs values obtained by measuring an alternating current voltage and an alternating current amount of an alternating current power supply 4. The controller 2 also inputs values obtained by detecting a direct current voltage and a direct current amount of the battery 12. The controller 2 predicts a life time of the battery 12 based on the inputted alternating current voltage, alternating current amount, direct current voltage and direct current amount.

Figure 3:
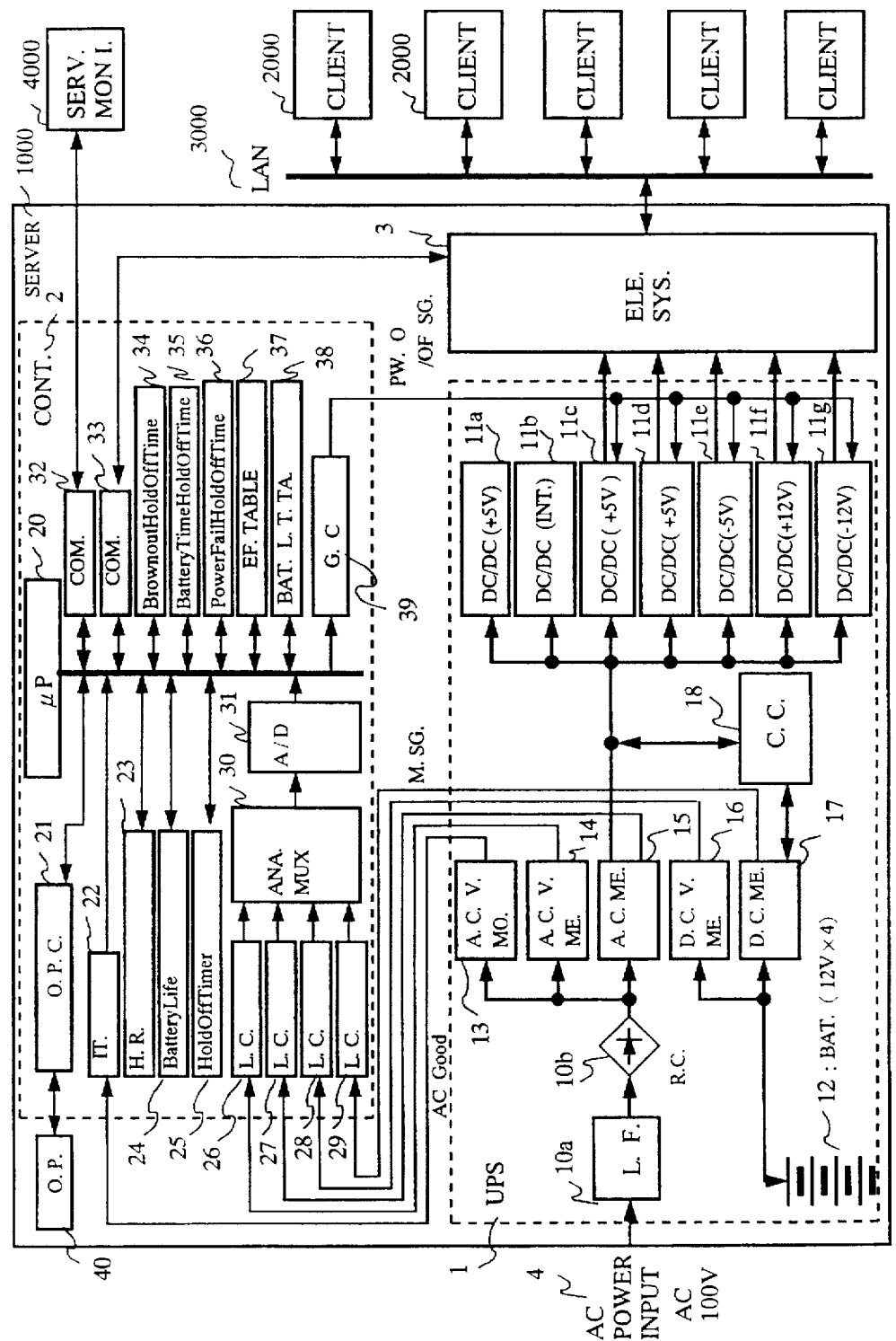
FIG. 3 shows another block diagram of UPS system of the present invention.

FIG. 3 shows a detailed configuration of the hardware of the server 1000 shown in FIG. 2. The AC/DC converter 10 of the UPS 1 includes a line filter 10a and a rectifying circuit 10b, and converts the alternating current to the direct current. A monitor 13 for alternating current voltage monitors a voltage of alternating current in order to recognize starting of power supply from the alternating current power supply 4 and find generation of an abnormal condition in the alternating current power supply 4. The monitor 13 for alternating current voltage outputs an AC Good signal to the controller 2. The AC Good signal shows whether the alternating current power supply 4 is normally supplying the power or not.

A measuring unit 14 for alternating current voltage measures alternating current voltage from the alternating current power supply 4. A measuring unit 15 for alternating current measures an amount of alternating current from the alternating current power supply 4. A measuring unit 16 for direct current voltage measures a voltage of direct current of the battery 12. A measuring unit 17 for direct current measures a direct current amount of the battery 12. Values measured by the measuring units 14 to 17 are output to the controller 2 as monitor signals.

A controlling circuit 18 for charging and discharging charges the battery 12 by power from the alternating current power supply 4. When an abnormal condition is generated in the alternating current power supply 4, the controlling circuit 18 for charging and discharging supplies power from the battery 12 to the electronic system 3. DC/DC converters 11a to 11g generate direct current of various voltages needed for operating the UPS 1, the controller 2 and the electronic system 3, and outputs the generated direct current.

A microprocessor 20 included in the controller 2 performs various controls when the system is operated by the alternating current power supply 4 and the battery 12. Firmware (F/W, not shown) is also included in the controller 2, to work with the microprocessor 20. An operation panel controller 21 displays conditions of the alternating current power supply 4 and the battery 12, using an operation panel 40. An interrupt circuit 22 inputs the AC Good signal from the monitor 13 for alternating current voltage in order to check starting of power supply and generation of an abnormal condition in the alternating current power supply 4, and informs the microprocessor 20 of the conditions of the alternating current power supply 4. The controlling circuit 18 controls supplying power from the battery 12. A holding register 23 for average consumed power is a register for holding an average amount of direct current consumed during a specific period while the system is operated by the battery 12. A battery life register 24 is a register for storing a battery life time predicted by the controller 2. A hold off timer 25 is a register for counting down life times of various modes when the system is operated by the battery 12. Level converters 26 to 29 input values measured by the measuring units 14 to 17 in the UPS 1, as monitor signals and convert levels of the inputted signals. An analog multiplexer 30 inputs values from the level converters 26 to 29, multiplexes the inputted values and outputs the selected values. An analog digital converter 31 converts analog values of voltage and current to digital values. A communication unit 32 communicates with a personal computer (called a sever monitor, hereinafter) 4000 for management. The server monitor 4000 has a maintenance function of monitoring and managing the server 1000 from a remote place. A communication unit 33 communicates with the electronic system 3. The communication unit 33 gives warnings and directions to the electronic system 3 during the battery 12 operation. A brownout holdoff time register 34, a battery time holdoff time register 35 and a power fail holdoff time register 36 are registers for setting each time of three modes (stated later) in the case of the system being operated by the battery 12. An efficiency table 37 is a table for storing efficiency of converting alternating current to direct current. A battery life time table 38 is a table for calculating a life time of the battery based on residual charging capacity of the battery and an amount of direct current discharged from the battery. A generation circuit 39 for power on/off signal recognizes a state whether a power switch of the system (not shown) is on or off, and generates a power on/off signal. When the power switch is off, the DC/DC converters 11c to 11g do not operate and a power supply to the electronic system 3 is stopped.

Figure 4:
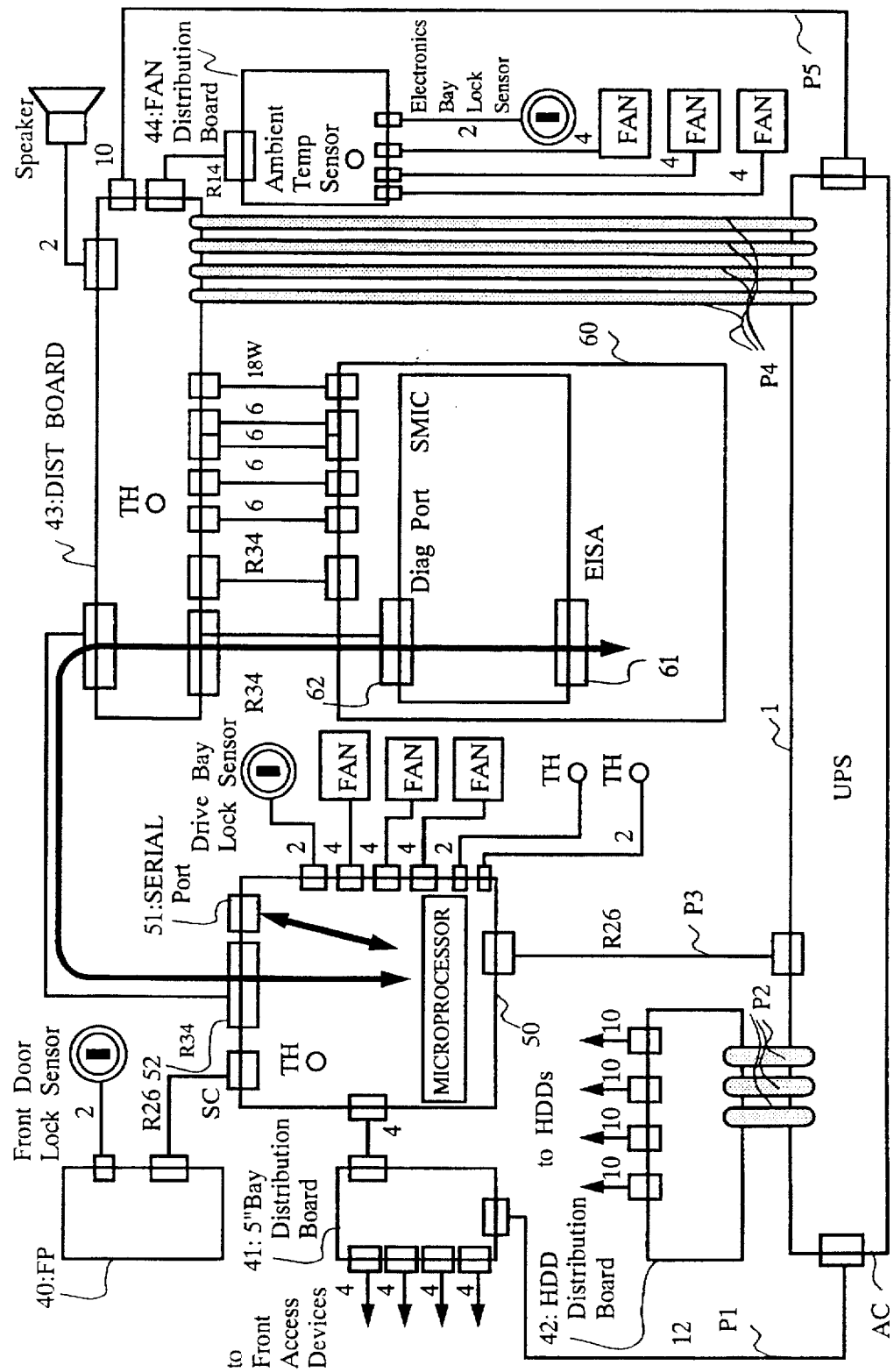
FIG. 4 shows a configuration of hardware for UPS control system of the present invention.

FIG. 4 shows a configuration of physical configuration in the server 1000 shown in FIGS. 2 and 3. The UPS 1 is put in one box and supplies power to boards in the server 1000. A control board 50 including the controller 2 and a system board 60 including the electronic system 3 are in the server 1000. The operation panel (or front panel) 40, 5 inches bay distribution board 41, hard disk drive (HDD) distribution board 42, distribution board 43 and fan distribution board 44 are also in the server 1000. The UPS 1 is connected to boards via lines P1 to P5. Each of the lines P1 to P5 is consisted of plural lines. The UPS 1 supplies power to each board and each device directly or indirectly, using a part of the plural lines. The lines P2 and P4 are exclusive lines for power supply, and high capacity lines than lines P1, P3 and P5 are used for them. Therefore, it is possible to supply enough power from the lines P2 and P4 to boards and devices which consume a large amount of power.

Plural fans are applied inside the server 1000. Rotation of the fans is controlled based on a detected temperature of a thermal sensor TH. Various kinds of lock sensors are also applied in the server 1000.

A serial port 51 is used for the communication unit 32 in order to communicate with the server monitor 4000 for management. A port 52 is used for the communication unit 33 and connected to a port 62 via the distribution board 43 so as to make the control board 50 communicate with the system board 60.

Numbers beside signal lines in FIG. 4 indicate the numbers of the signal lines. Number 4, beside the signal line connecting the 5 inches bay distribution board 41 and the control board 50, indicates that there are four signals lines between the boards 41 and 50, for instance. A letter R and number beside the signal line indicates the numbers of the signal lines and that a ribbon cable is used. For example, R26 besides the signal line connecting the UPS 1 and the control board 50 indicates that a ribbon cable having twenty-six signal lines is used for the line P3. The above stated signal lines for supplying power and signal lines for transmitting AC Good signals, monitor signals and power on/off signals shown in Fig.3 are included in the twenty-six signal lines of the line P3 connecting the control board 50 and UPS 1.

Figure 5:
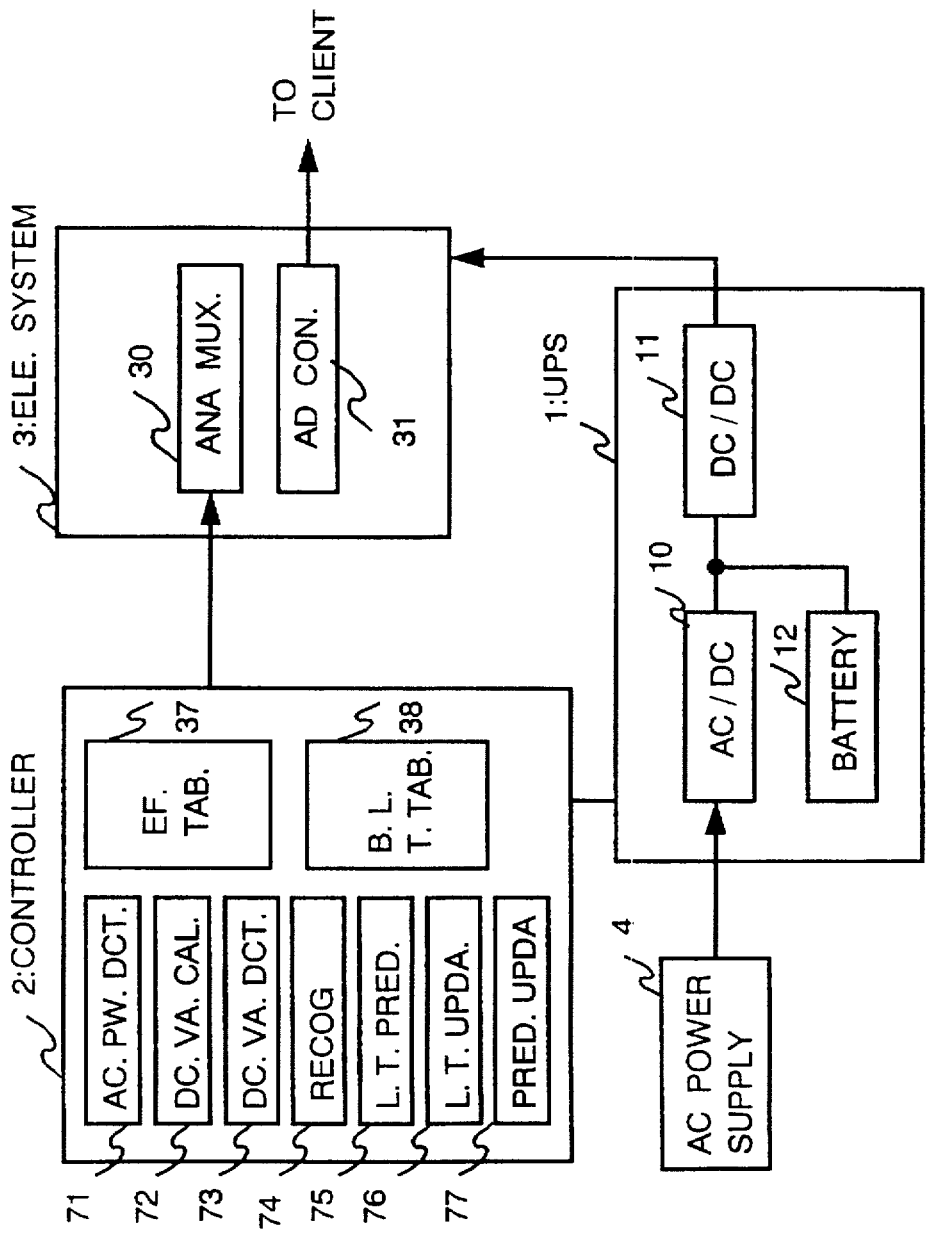
FIG. 5 is a block diagram logically showing UPS control system of the present invention.

FIG. 5 illustrates a logical configuration of the controller and an electronic system of the server. Various means in the controller 2 shown in FIG. 5 are accomplished using the hardware, such as the microprocessor 20, the registers 23 to 25, and 34 to 36, firmware and software (not shown) in the controller 2 of FIG. 3. The microprocessor 20, the firmware and the software operate as follows using the registers and the tables in the controller 2 shown in FIG. 3.

An AC power detecting means 71 calculates alternating current power based on a value of the alternating current voltage and an amount of the alternating current measured by the measuring unit 14 for alternating current voltage and the measuring unit 15 for alternating current. A DC value calculating means 72 calculates DC values corresponding to alternating current power, using the calculated alternating current power by the AC power detecting means and the efficiency table 37. A DC value detecting means 73 detects an average value of direct current of the battery measured by the measuring unit 17 for direct current. Values detected by the DC value detecting means 73 are stored in the holding register 23 for average consumed power. A recognition means 74 for residual charging capacity recognizes residual charging capacity of the battery based on the measured voltage by the measuring unit 16 for direct current voltage, by using a known method as stated in the Related Art. The characteristic of the present invention is to detect a life time of the battery based on the residual charging capacity of the battery, not to detect residual charging capacity of the battery. Therefore, method for detecting the residual charging capacity of the battery is not stated in this embodiment.

A life time predicting means 75 predicts an initial life time of the battery using the DC value calculated by the DC value calculating means 72 and the battery life time table 38. A life time updating means 76 counts down a predicted life time according as time passes. A prediction updating means 77 repeatedly updates the life time of the battery using the average amount of consumed direct current detected by the DC value detecting means 73 and the battery life time table 38. The prediction updating means 77 also compares the life time counted down by the life time updating means 76 with a new predicted life time, and sets a shorter life time of the two as a new life time.

A receiving means 90 of the electronic system 3 receives a state of processing at the controller 2 and a warning from the controller 2. An outputting means 91 outputs warnings to the clients 2000 or to the outside based on the state and the warning received by the receiving means.

FIGS. 6 and 7 show tables of signals input and output at the UPS 1. The above stated AC Good signals, monitor signals and the power on/off signals are included in these tables. FIG. 6 shows a table for digital control signals and FIG. 7 for analog control signals.

A column for signal 501 in the table of FIG. 6 shows kinds of the digital control signal. A column for UPS I/O 502 shows whether the digital control signals are input or output at the UPS. Columns for Level 503a in True 503 and Level 504a in False 504 show values of the digital control signal and Meaning 503b and Meaning 504b show meaning of each Level.

The table for analog control signal in FIG. 7 has columns of Signal 511, UPS I/O 512 and Meaning 513. The column of Signal 511 shows kinds of the analog control signal. The column of UPS I/O 512 shows whether the analog control signals are input or output. The column of Meaning 513 shows meanings of the analog control signals.

FIG. 8 is a table showing UPS mode truth value. This UPS mode truth value table shows a state of UPS in State 520 column, truth value of the AC Good signal in AC Good 521 column, and truth value of the DC Good signal in DC Good 522 column.

Figure 9:
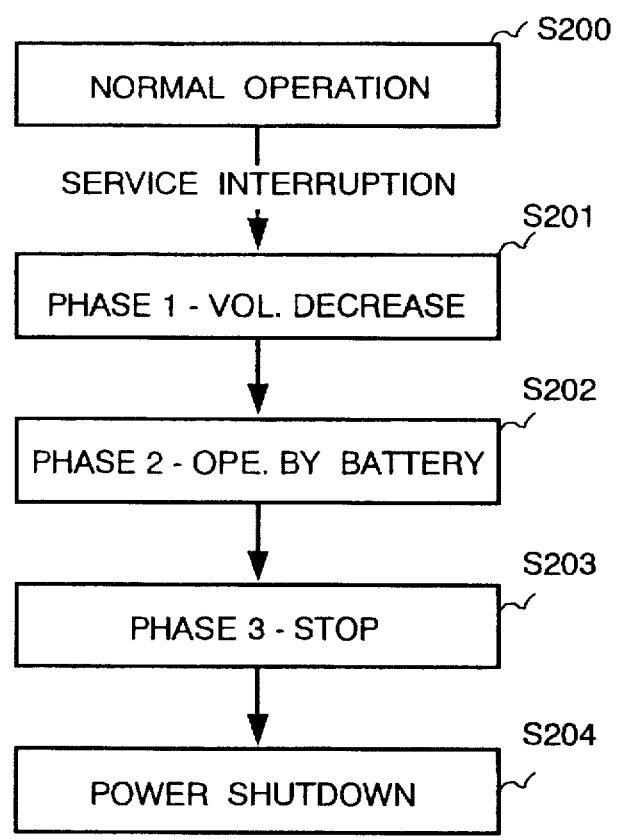
FIG. 9 shows a state transition of UPS at a service interruption, according to the present invention.

Three phases of the UPS of this embodiment will now be described with reference to FIG. 9.

When service interruption is generated in the UPS 1 during a normal operation at a step S200, the state is switched to a phase 1, at a step S201. Similar to the Related Art, time needed for the phase 1 is a fixed time. The time for the phase 1 in this embodiment is defined to be fifteen seconds, for instance. If the alternating current power supply returns to a normal condition during the phase 1, the system returns to the normal operation. If the time defined in advance (fifteen seconds in this embodiment) has passed without the alternating current power supply being returned to the normal condition, the state goes to a phase 2 shown in a step S202. It is a great advantage of this embodiment that time needed for the phase 2 is variable. A description of how the duration of phase 2 varies will be described later. If the alternating current power supply is returned to the normal condition during the phase 2, the state, similar to the phase 1, goes back to the normal operation shown in the step S200. If the defined time has passed without the alternating current power supply being returned to the normal condition, the state goes to a phase 3 at a step S203. Differing from the Related Art, time needed for the phase 3 is fixed. For example, time needed for a electronic system to stop the operating system (OS) is set as the fixed time. After finishing the process of stopping the OS, the phase 3 is finished. In a special case, that is, at the real residual charging capacity of the battery becomes zero, the phase 3 is finished before the fixed time is passed. Then, the state goes to a step S204 of shutting down the power of the system.

The user can be informed of the state transition such as the above by display of an operation lamp applied at the operation panel 40. Simultaneously, a warning (alarm sound) is given to the user. Outputs of the operation lamp and the alarm corresponding to each phase of FIG. 9 are shown in FIG. 10. When the operation lamp is green, it indicates that the system is operated by the alternating current power supply. When red, it indicates operated by the battery of the UPS. If the green of the operation lamp is flickering, it indicates that the system is operated in the normal condition and the battery of the UPS is on charge. The red of the operation lamp is on during the periods of the phase 1 and the phase 2. Relating to the alarm, it sounds low during the phase 1 and sounds higher than the phase 1 during the phase 2. The user can be informed that the system is operated with the battery of the UPS, by the alarm sound.

When the state is moved to the phase 3, the red of the operation lamp starts flickering, so that the user is informed that the residual charging capacity of the battery of the UPS becomes very little. The alarm sounds higher than the phase 2 at this stage. When the phase 3 is finished and the power of the system is shut down, the alarm and the operation lamp, are turned off.

If there is residual charging capacity in the battery of the UPS even after the power of the system being shut down, the communication unit 32 can respond to a connection to the serial port 51 from the server monitor 4000. In the case of the communication unit 32 being on the response to the server monitor 4000, the operation lamp becomes red once, and the lamp turns to off again when the response is finished.

Figure 11:
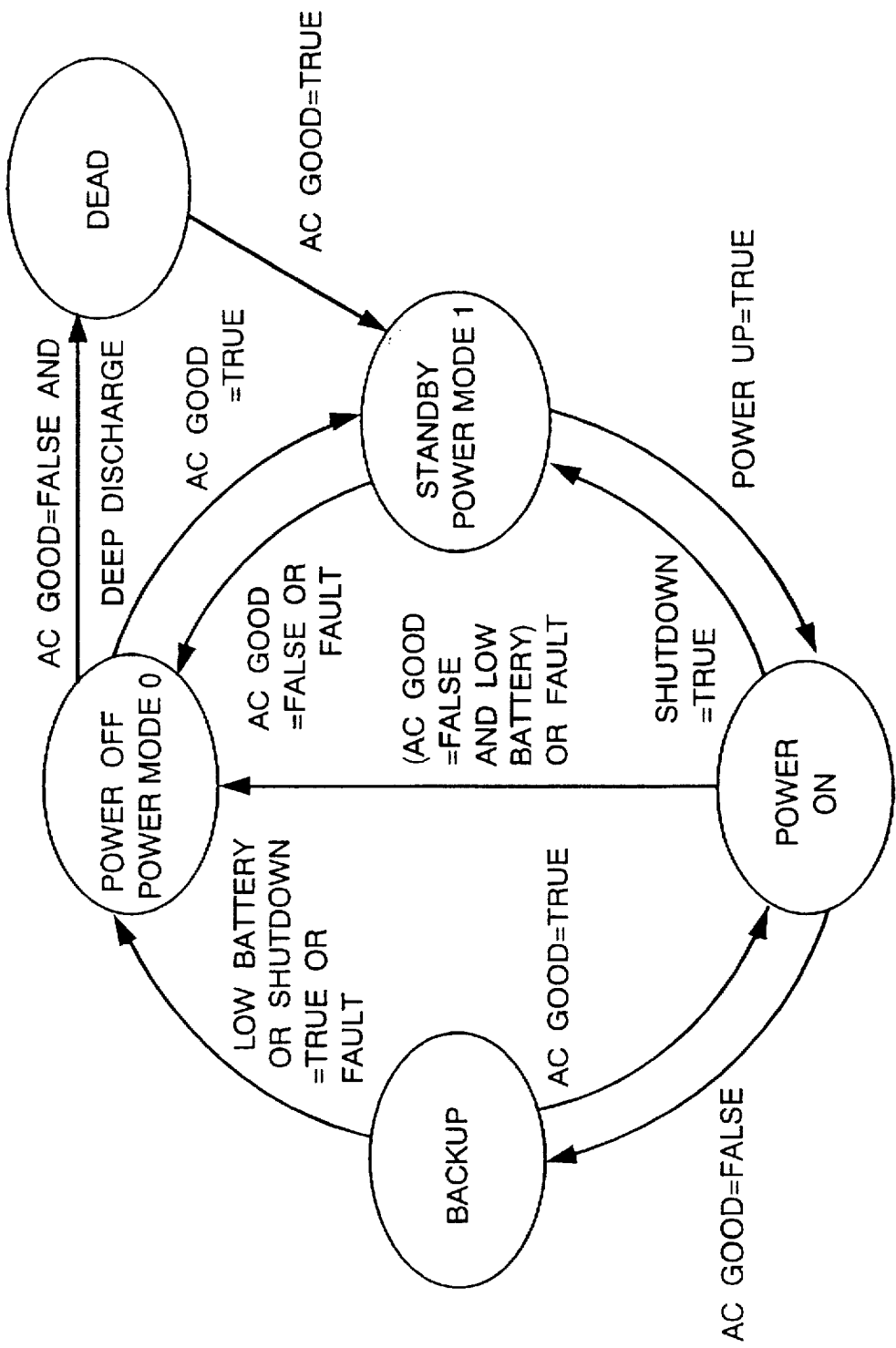
FIG. 11 shows a chart for UPS state transition according to the present invention.

The state transition at the service interruption seen from the user has been described with reference to FIG. 9. State transition of the UPS corresponding to the control signals is shown in Fig; 11. The UPS of this embodiment changes in five states depending upon values of the control signals as shown in FIG. 11. The signal used in FIG. 11 is either the digital control signal or the analog control signal. The state "Back up" in FIG. 11 includes the phases 1 to 3 shown in FIG. 9 altogether. A chart of state transition of the UPS showing detailed explanation of the state "Back up" is displayed in FIG. 12. Steps from a step S301 of Power Off mode to a step S306 of AC Power Fail mode will now be explained. A variable Power mode is used to indicate each mode.

Power Off mode

During Power Off mode, the value of Power mode is set at 0 (Power Off). For example, in this Power Off mode, the power switch is not on and a power plug is not connected to an outlet of the alternating current power supply 4. In this mode, the H/W of the controller 2 is in a sleep mode and the controller 2 does not execute system state monitoring. When the power plug is connected to the outlet and the controller 2 detects the AC Good signal becoming active by the interrupt circuit 22, the H/W of the controller 2 leaves the sleep mode, and the microprocessor 20 and F/W set the Power mode at 1 (Standby).

Standby mode

During Standby mode, the value of Power mode is set at 1 (Standby). In this mode, the controller 2 does not execute system state monitoring. When the microprocessor 20 and F/W detect the AC Good signal becoming inactive, the microprocessor 20 and F/W set the Power mode at 0 (Power Off) and begin to sleep. At this time, if the microprocessor 20 and F/W of the controller 2 communicate with some remote connected clients, the timing of sleeping will be delayed until the communication ends. When the microprocessor 20 and F/W detect the DC Good signal becoming active (by manual, remote or automatic power switch on), the microprocessor 20 and F/W set the Power mode at 2 (Power On).

Power On mode

During Power On mode, the value of Power mode is set at 2 (Power On). In this mode, the controller 2 executes system state monitoring. When the controller 2 activates a shutdown signal (shown in FIG. 6) to UPS, or the controller 2 detects the DC Good signal becoming inactive during the AC Good is active, the microprocessor 20 and F/W set the Power mode at 1 (Standby). When the controller 2 detects the DC Good signal becoming inactive or the battery voltage becoming too low, and then the AC Good is inactive, the microprocessor 20 and F/W set the Power mode at 0 (Power Off) and begin to sleep. When the controller 2 detects the AC Good becoming inactive during the DC Good is active, the microprocessor 20 and F/W set the Power mode at 3 (Brownout) and set the hold off timer 25 at Brownout Hold Off Time in the register 34 and start to count down the hold off timer 25. The microprocessor 20 and F/W will also generate a trap to the communication unit 33 in order to inform the electronic system that the Power mode has been changed.

Brownout mode

Brownout mode corresponds to phase 1. During Brownout mode, the value of Power mode is set at 3 (Brownout). The microprocessor 20 and F/W of the controller 2 decrease the hold off timer 25 by one every second. When the controller 2 activates the shutdown signal to UPS (by shutdown request or emergency power-off condition) or the controller 2 detects the DC Good signal becoming inactive or the battery voltage becoming too low, the microprocessor 20 and F/W stop the hold off timer 25 and set Power mode at 0 (Power Off) and then begin to sleep. When the controller 2 detects AC Good becoming active, the microprocessor 20 and F/W stop the hold off timer 25 and set the Power mode at 2 (Power On). The microprocessor 20 and F/W will also generate a trap to the communication unit 33 in order to inform the electronic system 3 that the Power mode has been changed. When the hold off timer 25 expires, the microprocessor 20 and F/W set the Power mode at 4 (Battery Time) and set the hold off timer 25 at Battery Time Hold Off Time in the register 35, and start the hold off timer. The microprocessor 20 and F/W will also generate a trap to the communication unit 33 in order to inform the electronic system 3 that the Power mode has been changed.

Battery Time mode

Battery Time mode corresponds to phase 2. During Battery Time mode, the value of Power mode is set at 4 (Battery Time). The microprocessor 20 and F/W of the controller 2 decrease the hold off timer 25 by one every second. When the controller 2 activates the shutdown signal to UPS (by shutdown request or emergency power-off condition), or the controller 2 detects the DC Good signal becoming inactive or the battery voltage becoming too low, the microprocessor 20 and F/W set the Power mode at 0 (Power Off) and stop the hold off timer 25 and then begin to sleep. When the controller 2 detects AC Good becoming active, the microprocessor 20 and F/W set the Power mode at 2 (Power On) and stop the hold off timer 25. The microprocessor 20 and F/W will also generate a trap to the communication unit 33 in order to inform the electronic system 3 that the Power mode has been changed. When the hold off timer 25 expires, the microprocessor 20 and F/W set the hold off timer 25 at Power Fail Hold Off Time in the register 36, and start the hold off timer 25 and set the Power mode at 5 (AC Power Fail). The microprocessor 20 and F/W will also generate a trap to the communication unit 33 in order to inform the electronic system 3 that the Power mode has been changed.

AC Power Fail mode

AC Power Fail mode corresponds to phase 3. During AC Power Fail mode, the value of Power mode is set at 5 (AC Power Fail). The microprocessor 20 and F/W of the controller 2 decrease the hold off timer 25 by one every second. When the controller 2 activates the shutdown signal to UPS (by shutdown request or emergency power-off condition), or the controller 2 detects the DC Good signal becoming inactive or the battery voltage becoming too low, the microprocessor 20 and F/W stop the hold off timer 25 and set the Power mode at 0 (Power Off) and then begin to sleep. Even if the controller 2 detects AC Good signal becoming active during AC Power Fail mode, the microprocessor 20 and F/W persist the AC Power Fail mode. When the hold off timer 25 expires, if the AC Good signal is active, the microprocessor 20 and F/W set the Power mode at 7 (Reset Convert). When the hold off timer 25 expires, if the AC Good signal is inactive, the microprocessor 20 and F/W activate the shutdown signal immediately and set the Power mode at 0 (Power Off) and then begin to sleep.

Figure 13:
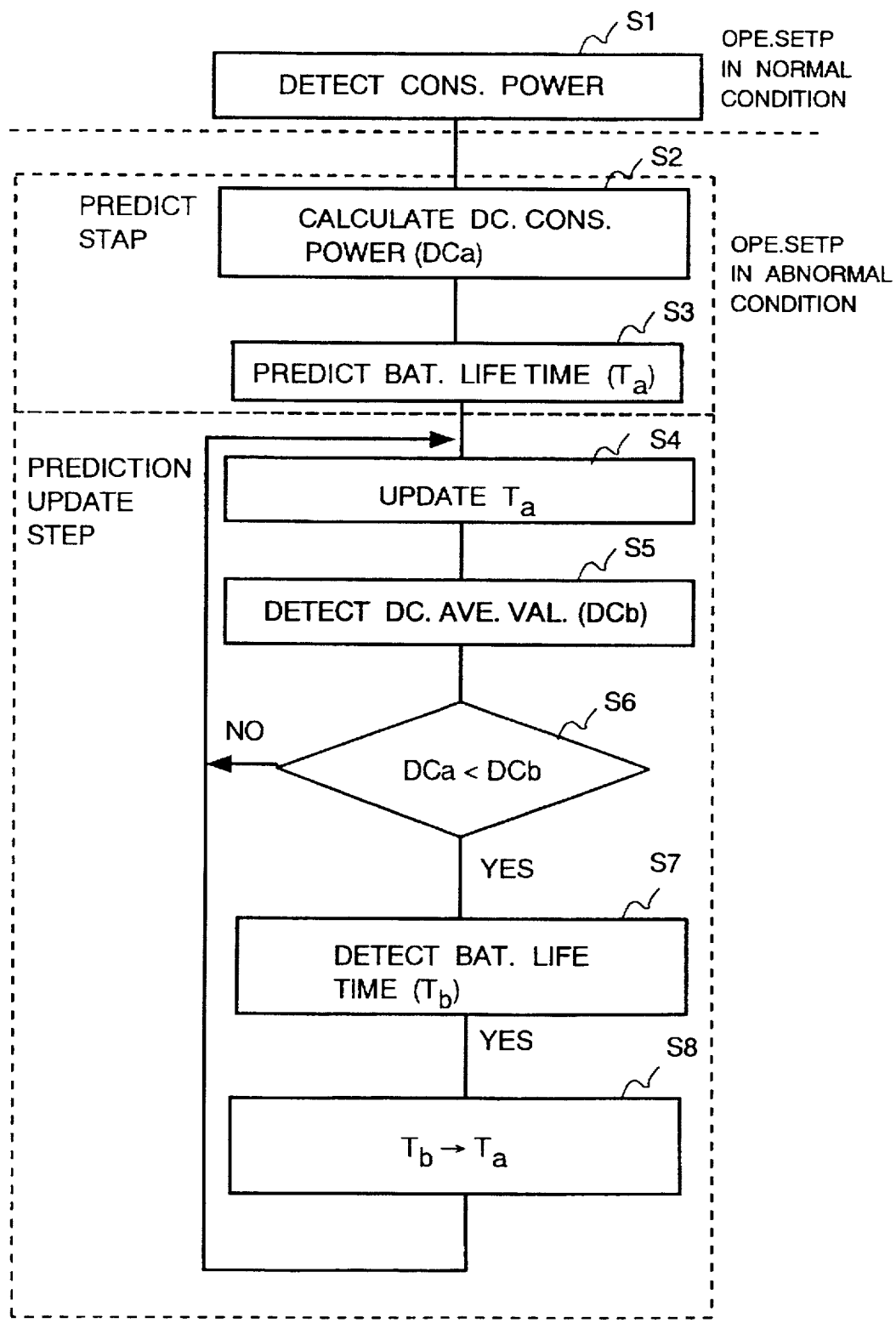
FIG. 13 shows a flowchart of life time prediction process according to the present invention.
Figure 14:
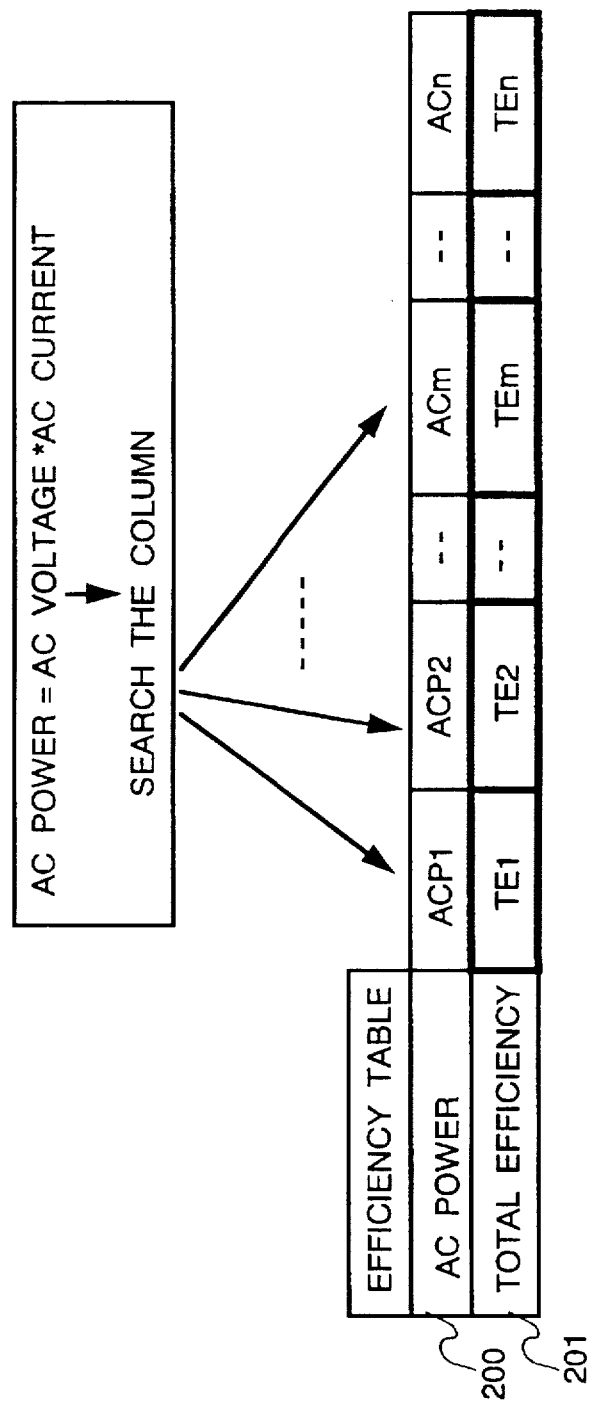
FIG. 14 shows an efficiency table according to the present invention.

FIG. 13 shows a flowchart of life time predicting process performed by the controller 2. The AC power detecting means 71 detects consumed power based on the alternating current power supply, at a step S1. Alternating current voltage and alternating current amount are measured at every specific period in order to obtain a value of consumed power. Then, a value of direct current power consumption of the system can be calculated at a step S2. An average value of the direct current power consumption is calculated at a specific period, such as ten seconds. Calculating the value of the direct current power consumption is necessary for predicting a life time of the battery. The efficiency table 37 shown in FIG. 14 is used for calculating the direct current power consumption of the system based on the measured alternating current voltage and alternating current amount. As the efficiency and a power factor of the power supply are not fixed, the efficiency table 37 is used for the calculation. There is an advantage that it is possible to flexibly deal with various types of UPS having a different characteristic, by rewriting the content of the efficiency table 37 from the outside. It, is also acceptable to provide an efficiency table corresponding to a different voltage, such as 100 V or 240 V.

As shown in FIG. 14, alternating current power is calculated by multiplying the alternating current voltage by the alternating current amount in order to obtain the direct current power consumption. Referring to a column of AC power 200 in the efficiency table 37 based on the calculated value of the alternating current power, a value of the efficiency can be obtained, at the corresponding alternating current power value. Then, the battery life time table 38 is consulted based on the obtained efficiency value.

Figure 15:
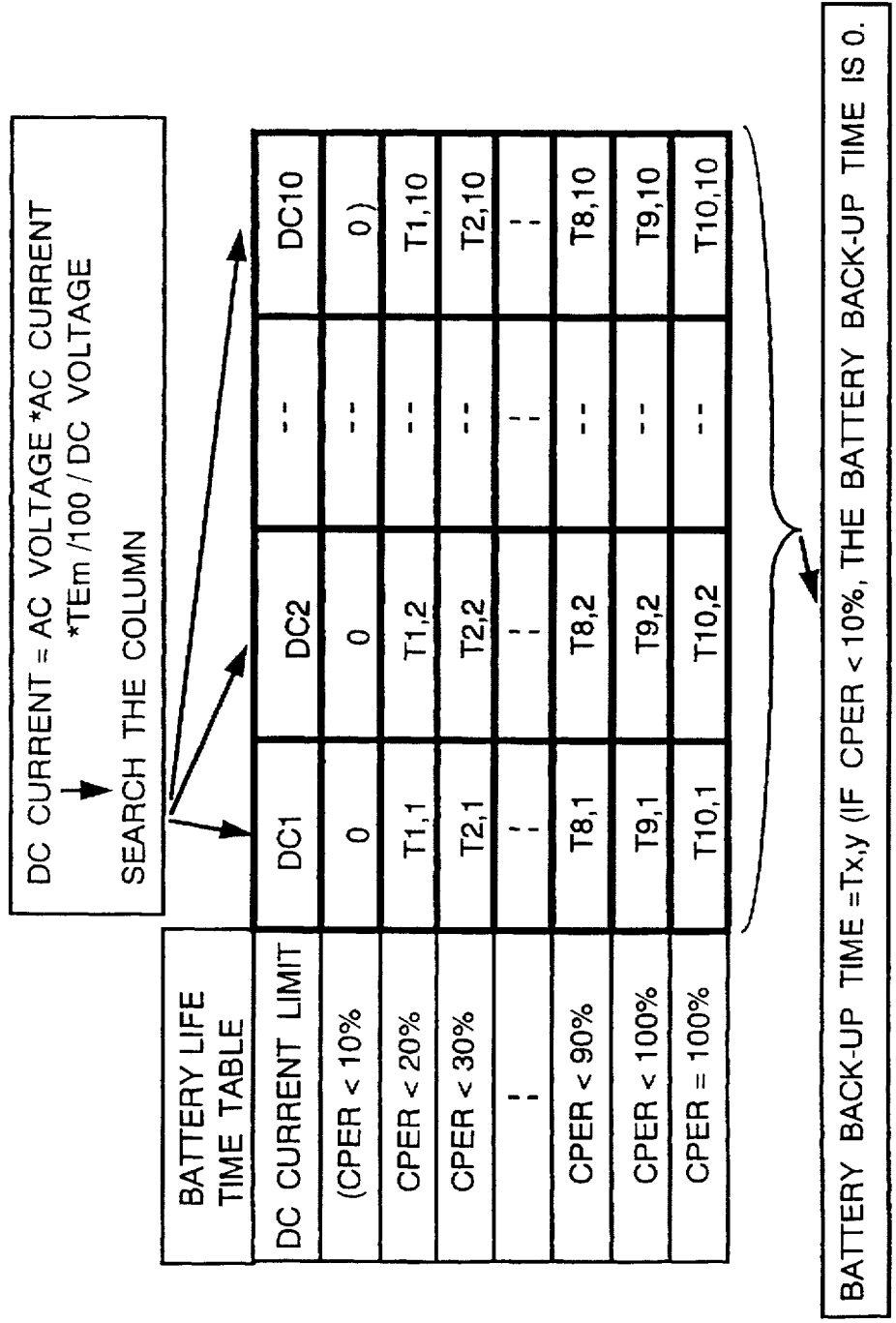
FIG. 15 shows a table for battery life time, according to the present invention.

FIG. 15 shows the battery life time table 38. Residual charging capacity of the battery are placed in the columns vertically aligned and amounts of the direct current are placed in the columns laterally aligned, in the battery life time table 38. The amount of direct current can be calculated by the following equation.

$$DC\ amount = AC\ voltage \times AC\ amount \times Efficiency/100/\ DC\ voltage$$

A battery life time Ta is obtained by referring to the battery life time table 38, using the value of the direct current obtained by the above equation and the battery charging capacity recognized by the recognition means 74 for residual charging capacity, as shown at a step S3 in FIG. 13. The above process of predicting the life time based on the alternating current power is performed only once by the life time predicting means 75 when the alternating current power supply 4 is switched to the battery.

The battery life time Ta is updated according as actual time passes, as shown in a step S4 of FIG. 13. When the battery life time Ta is expressed in seconds, 1 is subtracted from the value of the Ta according as every actual second passes. The subtraction of the battery life time Ta is performed by the life time updating means 76.

Even after the battery life time is predicted using the direct current power consumption calculated based on the measured alternating current, the operation state of the system and the consumed power change every moment. Especially when the system starts preparation for operation stopping, the value of the power consumption changes greatly. The life time of the battery is estimated continuously in the UPS of this embodiment for the purpose of corresponding with such a great change of the power consumption.

The DC value detecting means 73 measures an amount of current discharged from the battery at every specific period to calculate an average value at each specific period, as shown in a step S5 of FIG. 13. When a calculated average value DCb is larger than a direct current value DCa predicted based on the alternating current voltage and the alternating current amount, the life time of the battery is predicted again based on the battery life time table 38 using the calculated average value DCb, as shown in a step S6 of FIG. 13. At a step S7, a battery life time Tb is referred in the battery life time table 38, based on the calculated average value DCb of the direct current, and the battery residual charging capacity recognized by the recognition means 74 for residual charging capacity. A value of battery life time Ta is over written by the value of the battery life time Tb, as shown in a step S8 of FIG. 13. The prediction updating means 77 updates the battery life time by repeating the steps from S5 to S8.

Overestimation of the life time of the battery, caused by increase or decrease of the power consumption of the system, is prevented by calculating the average value of the direct current discharged from the battery continuously. In addition, length of the period interval and length of the period for measuring an average value of direct current is defined to be shorter than the length of the period interval and the length of period for measuring during the operation by the alternating current power supply. The reason is that it is necessary for the life time estimation to reflect a quick and dynamic change of the power consumption during the operation by the battery.

The following operation mode switching is needed for safely performing the continuous operation of the system and safely stopping operation of the system, using the battery life time calculated as the above.

After switching from the alternating current power to the battery power, caused by a stop of the alternating current power supply or a decrease of the voltage, the mentioned three modes are performed in the controller.

(1) Brownout mode:

As mentioned, this mode corresponds to the phase 1. The stop of alternating current power supply or the decrease of voltage in this mode is assumed to be temporary, so that operation of the system is continued. If necessary, the software sends a warning to a system user. In the case that the alternating current power supply is returned to the normal condition during this mode, the system operation can be continued without getting any influence. If the alternating current power supply does not return to the normal condition within a defined time, it goes to Battery Time mode.

(2) Battery Time mode:

As mentioned, this mode corresponds to the phase 2. The stop of alternating current power supply or the decrease of voltage in this mode is assumed to be continuous. If the battery continues to be consumed, the mode is changed to AG Power Fail mode, and the system starts stopping process. When a software (not shown) in the electronic system is informed of entering this mode, the software, if necessary, tells that the system is going to start stopping operation in a defined time to a system user of this electronic system or to the clients and to another computer system connected to this electronic system via lines and local area network (LAN).

(3) AC Power Fail mode:

As mentioned, this mode corresponds to the phase 3. When the software in the electronic system is informed of entering this mode, the software immediately starts stopping operation of the system. After the stopping process being finished, the controller is informed of finishing the stopping process and then stops power outputting from the UPS.

There is a possibility of the battery becoming dead during the system operation, because the battery life time becomes short depending upon the residual charging capacity of the battery or the power consumption state of the system. Accordingly, length of continuation time of each mode is dynamically determined based on the following procedures, in this embodiment.

The following three values are set in registers 34, 35 and 36 of the controller in advance, as the maximum value of the continuation time length of each mode.

(1) Brownout Hold Off Time:

This time is necessary to cover a time for instant service interruption or instant voltage decrease, generation of which can be anticipated in the environment of alternating current power supply used in the electronic system. Therefore, the Brownout Hold Off Time is a relatively short time (for example, fifteen seconds) which is a relatively longer than the time for instant service interruption or instant voltage decrease.

(2) Battery Time Hold Off Time:

This is a time for the system user to prepare for the system stopping, after the stop of electronic system previously being announced. If there is enough charging capacity of the battery for the power consumption of the system, this Battery Time Hold Off Time is defined to be long.

(3) Power Fail Hold Off Time:

This time is necessary for the electronic system to stop.

Values of the above times can be changed from the outside in order to deal with a system changing flexibly. Therefore, even if the power consumption of the system is changed largely by a change of the system configuration and so on, it is possible to set new appropriate values for the system.

Switching of the three operation modes will now be explained with reference to FIGS. 16 to 18.

Figure 16:
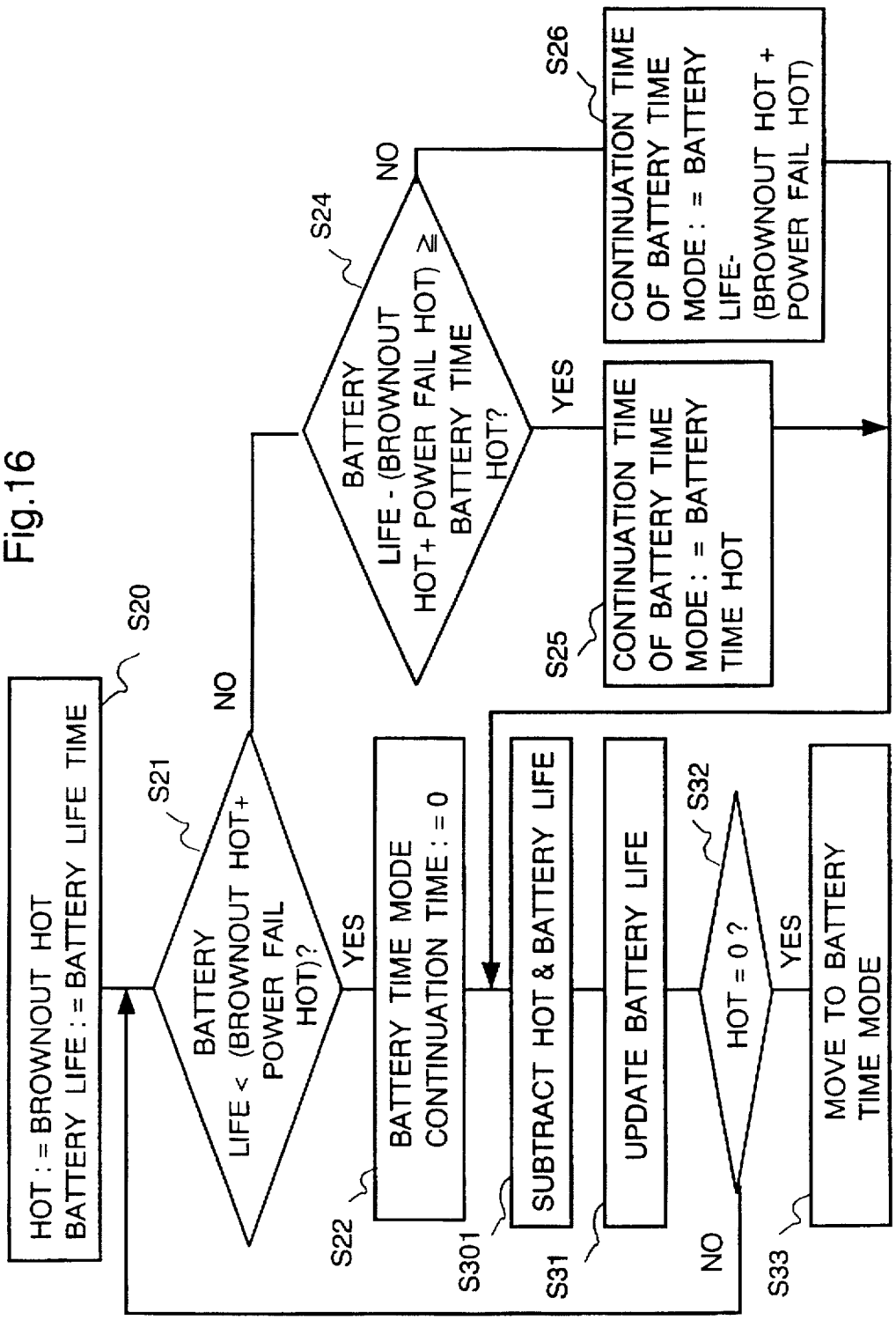
FIG. 16 shows a flowchart of process in Brown Out mode, according to the present invention.

FIG. 16 shows a flowchart of determining process of a continuation time of Battery Time mode in Brownout mode. The controller calculates the life time of the battery based on the battery residual charging capacity, system power consumption and battery life time table, using the above method while the electronic system is operated by the alternating current power supply. The calculated life time is stored in the battery life register 24. In the case that the battery is not fully charged during the electronic system being operated by the alternating current power supply, residual charging capacity is inferred based on charging time in every specific period. A value of the battery life time is continued to be updated.

When the controller detects that the alternating current power supply is switched to the battery because the alternating current power supply is stopped or the voltage decreases, the mode moves to Brownout mode. A value of Brownout Hold Off Time is used for a continuation time of Brownout mode. The controller sets the value of Brownout Hold Off Time in the hold off timer 25, as shown in a step S20 of FIG. 16.

At a step S21, a value of battery life register 24 (battery life time) is compared with a value of (Brownout Hold Off Time+Power Fail Hold Off Time). If the Battery Life value is smaller than the value of (Brownout Hold Off Time+Power Fail Hold Off Time), the continuation time of Battery Time mode is made to be 0(zero) at a step S22. However, even in this case, the mode does not move to Battery Time mode until the value of hold off timer 25 becomes 0(zero). The reason is that it is necessary to prevent the system from entering into frequent starting process and frequent stopping process caused by each instant service interruption or each instant voltage decrease. When "No" is given at the step S21, a value of battery life register 24–(Brownout Hold Off Time+Power Fail Hold Off Time) is compared with Battery Time Hold Off Time which is set in the register 35 in advance, at a step S24. When the value of Battery Life–(Brownout Hold Off Time+Power Fail Hold Off Time) is larger than Battery Time Hold Off Time, that is "YES " given at a step S25, the smaller time, that is Battery Time Hold Off Time, is defined to be the continuation time of Battery Time mode. If the value of battery life–(Brownout Hold Off Time+Power Fail Hold Off Time) is smaller than Battery Time Hold Off Time, that is "NO" given at a step S26, the smaller time of the two, that is Battery Life–(Brownout Hold Off Time+Power Fail Hold Off Time), is assigned to be the continuation time of Battery Time mode.

At a step S30, values of the hold off timer 25 and battery life register 24 are subtracted at every specific period until they become zero, at a step S30. The values of them are subtracted every one second, for instance. The Battery Life is updated by the prediction updating means 77, at step S31. When a value of the hold off timer 25 becomes 0(zero) at a step S32, the mode moves to the Battery Time mode as a step S33.

Figure 12:
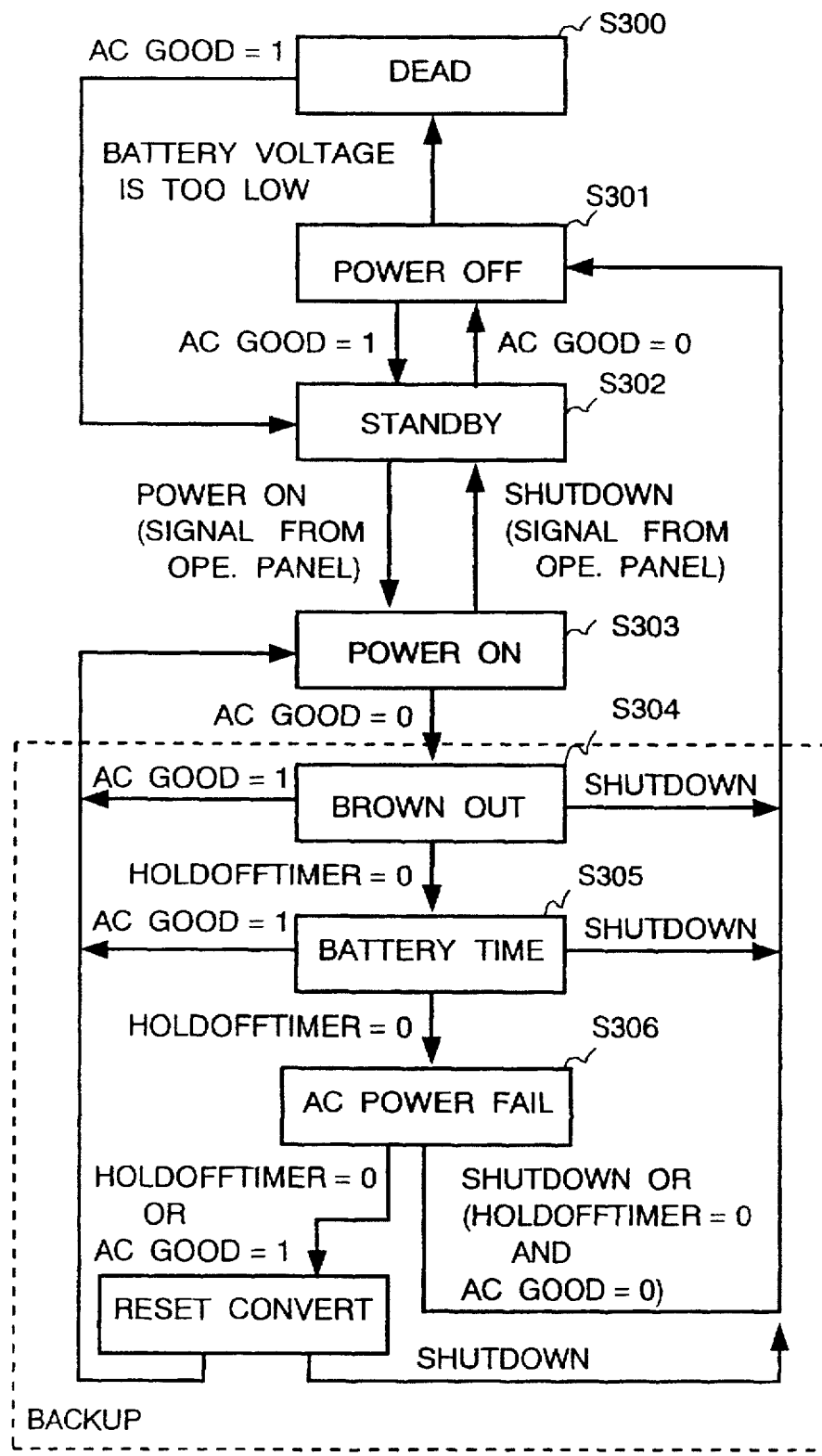
FIG. 12 shows another chart for UPS state transition according to the present invention.

Though it is not shown in FIG. 16, if the alternating current power supply is returned to the normal condition during the Brownout mode as shown in FIGS. 11 and 12, the controller informs the software of the normal state, and the system returns to the normal operation.

Accordingly, when the battery is fully charged, Battery Time Hold Off Time set in advance is used as a continuation time of Battery Time mode. In the case that the battery is not fully charged, a time corresponding to a residual charge amount in the battery is used as the continuation time of Battery Time mode. If there is never enough residual charging capacity in the battery, the Battery Time mode is passed and it is moved to the AC Power Fail mode immediately to start the system stopping.

Figure 17:
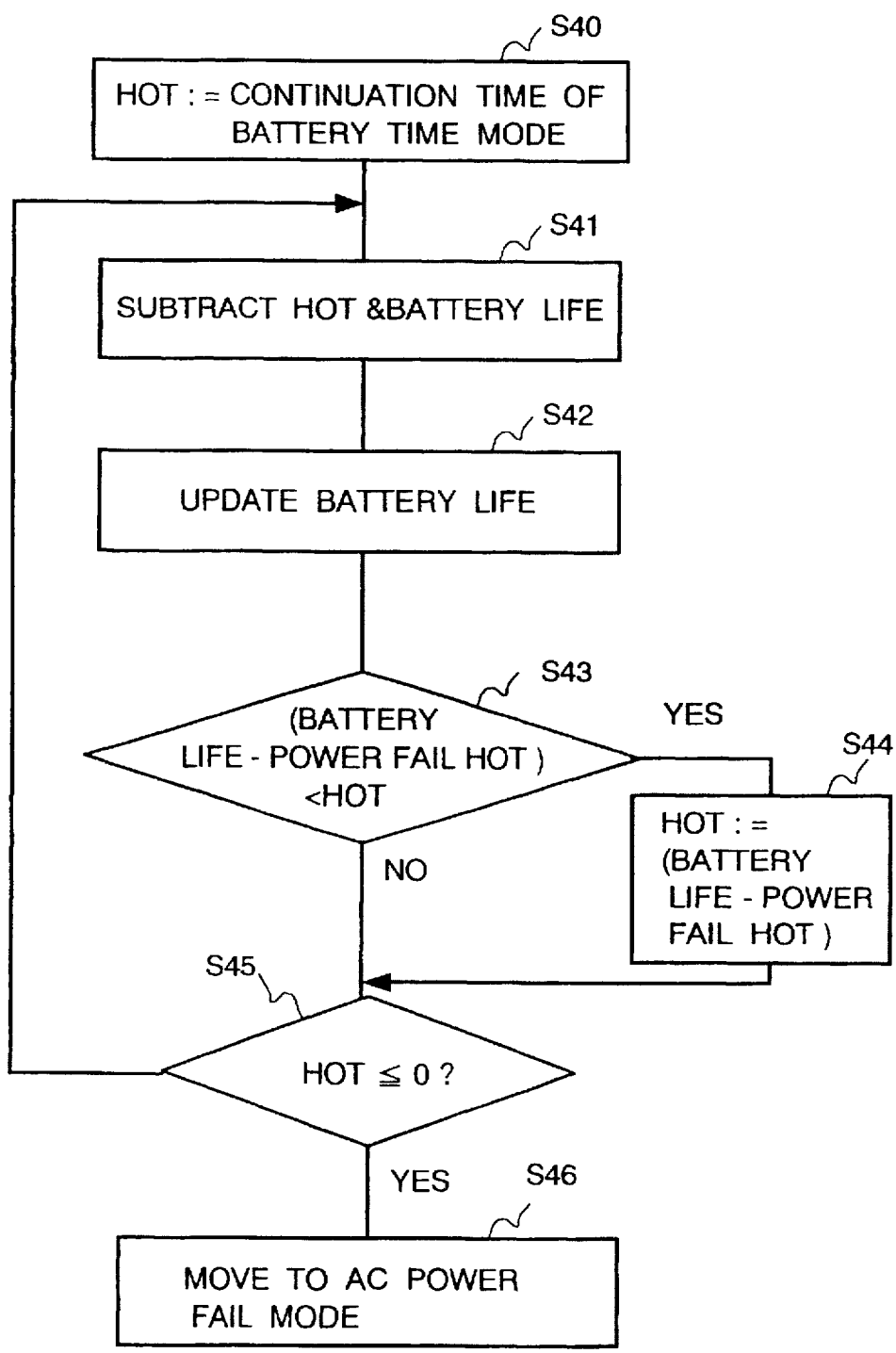
FIG. 17 shows a flowchart of process in Battery Time mode, according to the present invention.
Figure 18:
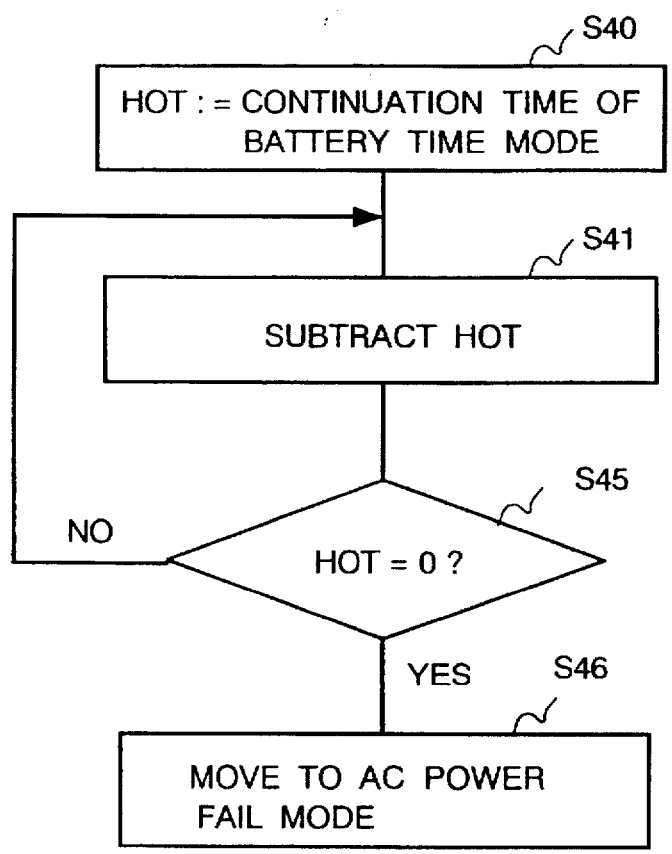
FIG. 18 shows another flowchart of process in Battery Time mode, according to the present invention.
Figure 19:
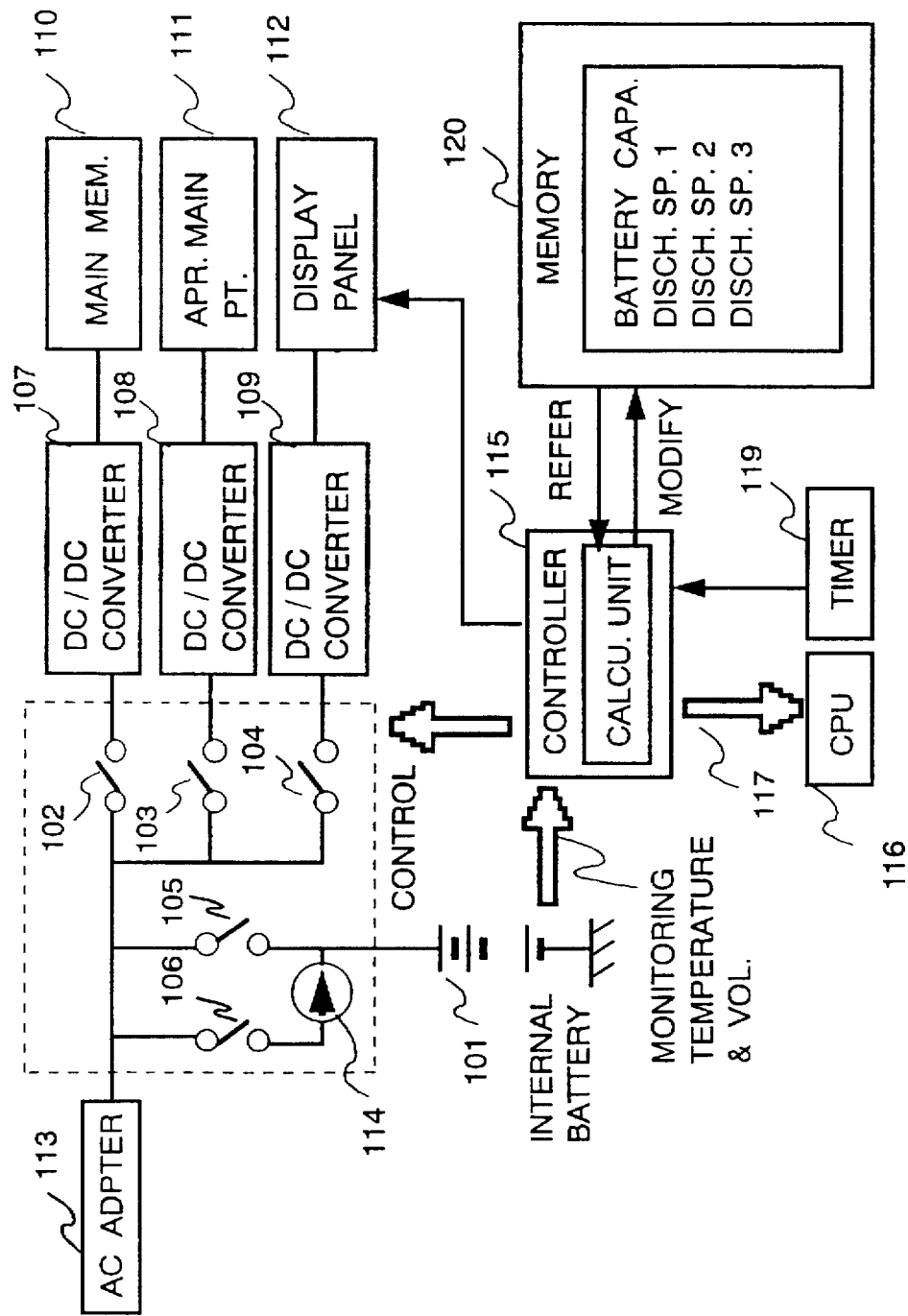
FIG. 19 shows a block diagram of a residual charging capacity detecting apparatus for a secondary battery in Related Art.
Figure 20:
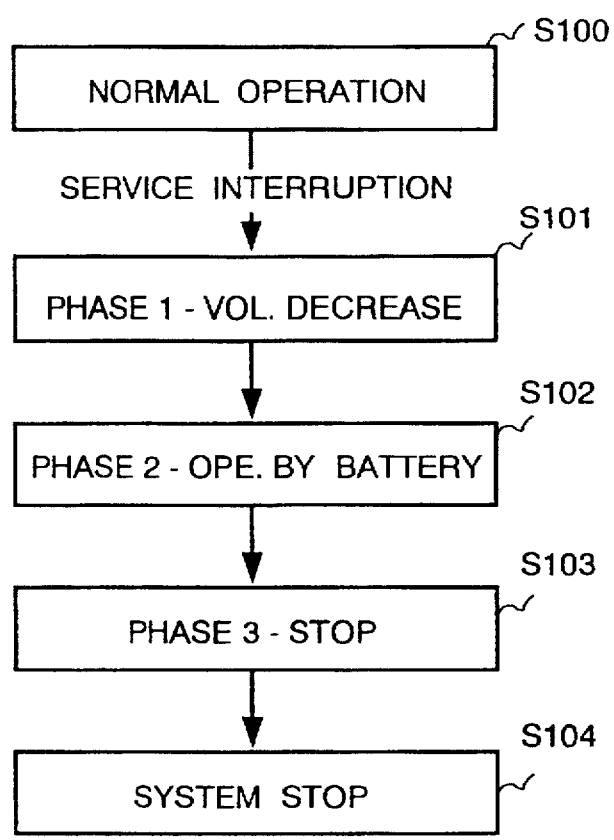
FIG. 20 shows a state transition of UPS at a service interruption in Related Art.

FIG. 17 shows a flowchart of process in Battery Time mode. The continuation time for Battery Time mode, which is defined by the above process, is set in the hold off timer 25, at a step S40. The value of this set time is subtracted at every specific period until it becomes zero. Similarly, the value of the Battery Life is subtracted, at a step S41. Simultaneously, as stated above, the value of the Battery Life is always updated based on an actual measured value of discharged power from the battery, at a step S42. At a step S43, a value of (Battery Life–Power Fail Hold Off Time) is compared with a value of the hold off timer 25 to check whether the value of (Battery Life–Power Fail Hold Off Time) is smaller than the value of the hold off timer 25. If YES is given, the value of (Battery Life–Power Fail Hold Off Time) is set in the hold off timer 25, at a step S44. When the value of the hold off timer 25 becomes 0(zero), the mode moves to the AC Power Fail mode at steps S45 and S46.

If the alternating current power supply is returned to the normal condition during the Battery Time mode, the controller informs the software of the normal state, and the system returns to the normal operation.

As stated above, the battery life time set at battery life resister 24 is updated continuously, so that it is possible to deal with a dynamic change of power consumption. The time needed for the system to perform a safe stopping, can be maintained by switching operation mode with predicting an accurate life time. In the Battery Time mode, it is also acceptable not to repeatedly update Battery Life time set at battery life register 24 by the prediction updating means 77, by using the continuation time determined in the Brownout mode. A flowchart in this case is shown in FIG. 18. The continuation time of the Battery Time mode is set in the hold off timer 25 just after it moves to the Battery Time mode, as shown in FIG. 18. When the value set in the hold off timer 25 becomes 0(zero), the mode moves to the AC Power Fail mode.

A value of Power Fail Hold Off Time is used as a continuation time of the AC Power Fail mode. The controller sets the value of the Power Fail Hold Off Time in the hold off timer 25. The value in the hold off timer 25 is subtracted at every specific period until it becomes 0(zero). Simultaneously, a value of the Battery Life is subtracted and the value of the Battery Life is repeatedly updated based on an actual measured value of discharged power from the battery, as stated above. If the value of the hold off timer 25 becomes zero, or power shutdown is required by the software in the electronic system since the preparation for the system stopping is finished, the controller stops power outputting of the UPS.

In the case of Battery Life<(Brownout Hold Off Time+ Power Fail Hold Off Time) at the switching time from the alternating current power supply to the battery, there is a possibility of the battery life time becoming 0(zero) before the hold off timer 25 becomes zero at the AC Power Fail mode because the battery life time is a calculated value. Although there is above stated possibility, sometimes there is a case that the battery has some residual charged amount in fact. Therefore, the operation is continued until the hold off timer 25 becomes 0(zero) at the Brownout mode. However, if it is detected that the battery is discharged perfectly and an output voltage of the battery becomes lower than a specific value, the power output from the UPS is stopped at once.

When the alternating current power supply is returned to the normal condition during periods of the Brownout Mode and Battery Time mode, the controller informs the software of the normal state, and the system returns to the normal operation. Even if the alternating current power supply is returned to the normal condition during the AC Power Fail mode, process of AC Power Fail mode is continued because the system is already in the stopping process.

As stated above, there is an effect that the battery life time of just after being switched to the battery, can be more accurately predicted by measuring the alternating current in the normal operation. In addition, after being moved to the Brownout mode, there is another effect that the continuation time of the Battery Time mode can be determined dynamically by using a life time obtained based on the average value of direct current, in the case of power being supplied by the battery.

Having thus described several particular embodiments of the invention, various alterations, modifications, and improvements will readily occur to those skilled in the art. Such alterations, modifications, and improvements are intended to be part of this disclosure, and are intended to be within the spirit and scope of the invention. Accordingly, the foregoing description is by way of example only, and not intended to be limiting. The invention is limited only as defined in the following claims and the equivalents thereto.

What is claimed is:

1. An uninterruptible power supply system comprising:
   (a) an uninterruptible power supply including a battery for supplying direct current (DC), for receiving alternating current (AC) from an alternating current power supply, converting the alternating current into direct current and outputting the direct current as one of the direct current converted from the alternating current and the direct current supplied by the battery;
   (b) an electronic system having an input to receive the direct current output from the uninterruptible power supply; and
   (c) a controller for calculating a value of power consumption of the electronic system based on AC parameters while the electronic system is operated by the direct current converted from the alternating current, for calculating a life time of the battery based on residual charging capacity of the battery, the value of power consumption, and a time needed to safely shutdown the electronic system when the electronic system starts operation by power from the battery, and for outputting the life time to the electronic system.

2. The uninterruptible power supply system of claim 1, wherein the controller further includes:
   AC power detecting means for detecting the power consumption in the alternating current;

17

DC value calculating means for calculating a value of direct current based on the power consumption; and life time predicting means for predicting the life time of the battery based on the value of direct current.

3. The uninterruptible power supply system of claim 2, wherein the controller further includes an efficiency table for storing conversion efficiency of converting from power consumption to direct current, and wherein the DC value calculating means calculates a value of direct current based on the power consumption using the efficiency table.

4. The uninterruptible power supply system of claim 3, wherein the efficiency table is defined to be corresponding to a voltage of the alternating current supply.

5. An uninterruptible power supply system comprising:

(a) an uninterruptible power supply including a battery for supplying direct current, for receiving alternating current from an alternating current power supply, converting the alternating current into direct current and outputting the direct current as one of the direct current converted from the alternating current and the direct current supplied from the battery;

(b) an electronic system having an input to receive the direct current output from the uninterruptible power supply; and (c) a controller for calculating a value of power consumption of the electronic system based on AC parameters while the electronic system is operated by the direct current converted from the alternating current, for calculating a life time of the battery based on residual charging capacity of the battery, a value of direct current from the battery, and a time needed to safely shutdown the electronic system while the electronic system is operated by power from the battery, and for alerting the electronic system to shutdown.

6. The uninterruptible power supply system of claim 5, wherein the controller further includes:

DC value detecting means for detecting the value of direct current from the battery; and life time predicting means for predicting the life time of the battery based on the value of direct current.

7. The uninterruptible power supply system of claim 6, wherein the DC value detecting means detects an average value of direct current values at a specific period and regards the average value as the value of the direct current.

8. The uninterruptible power supply system of claim 2 or 6, wherein the controller further includes:

recognizing means for recognizing residual charging capacity of the battery; and a battery life time table for storing a life time corresponding to the residual charging capacity of the battery and the value of direct current, wherein the life time predicting means included in the controller predicts the life time of the battery using the battery life time table.

9. The uninterruptible power supply system of claim 6, wherein the controller further includes:

life time updating means for updating the life time according as time passes; and prediction updating means for predicting a new life time by repeating detection of values of direct current detected by the DC value detecting means, wherein the prediction updating means compares life times obtained by the life time updating means and the prediction updating means in order to define a shorter life time of the two as the new life time.

18

10. The uninterruptible power supply system of claim 5, wherein the controller divides an operating time of the electronic system operated by power from the battery into an initial time in which it is regarded that a temporary abnormal condition is generated in the alternating current, an intermediate time in which it is regarded that a continuous abnormal condition is generated in the alternating current, and a last time in which stopping process of the electronic system is performed, and wherein the intermediate time is adjusted by the controller depending upon a length of the life time.

11. The uninterruptible power supply system of claim 10, wherein the controller maintains the initial time of a specific length.

12. The uninterruptible power supply system of claim 11, wherein the controller maintains the last time of a specific length.

13. The uninterruptible power supply system of claim 12, wherein the intermediate time is defined to be a time obtained by subtracting the last time and an unconsumed time in the initial time from the life time.

14. The uninterruptible power supply system of claim 13, wherein the controller stops being supplied power from the battery and outputs information on a normal condition to the electronic system when the alternating current is returned to the normal condition at the initial time and at the intermediate time.

15. The uninterruptible power supply system of claim 5 or 14, wherein the electronic system further includes receiving means for receiving information output from the controller and outputting means for outputting received information.

16. The uninterruptible power supply system of claim 15, wherein the electronic system is a server connected to a client and the outputting means sends the received information to the client.

17. A control method for an uninterruptible power supply, used for an electronic system operated by the uninterruptible power supply, comprising the steps of:

(a) operating the electronic system by a direct current converted from an alternating current power supply at an ordinary time;

(b) measuring power consumption of the electronic system based on AC parameters during the ordinary time;

(c) operating the electronic system by a battery at an extraordinary time;

(d) predicting a life time of the battery based on residual charging capacity of the battery, the power consumption measured by the power consumption measuring step, and a time needed to safely shutdown the electronic system at a starting time of the operating step at the extraordinary time; and (e) controlling operation of the electronic system based on the life time of the battery predicted by the predicting step.

18. A control method for an uninterruptible power supply, used for an electronic system operated by the uninterruptible power supply, comprising the steps of:

(a) operating the electronic system by a direct current converted from an alternating current power supply at an ordinary time;

(b) measuring power consumption of the electronic system based on AC parameters during the ordinary time;

(c) operating the electronic system by a battery at an extraordinary time;

(d) periodically detecting an average value of residual charging capacity of the battery and direct current from the battery at a specific period while the electronic system is operated by the battery, during the step of operating the electronic system at the extraordinary time, and predicting and updating a life time of the battery based on the average value of the residual charging capacity of the battery, the direct current from the battery, and a time needed to safely shutdown the electronic system; and (e) controlling operation of the electronic system based on the life time of the battery predicted by he predicting and updating step.

19. The control method for an uninterruptible power supply of claim 17 or 18, wherein the controlling step includes the steps of:

determining that a temporary abnormal condition in the alternating current power supply exists when the extraordinary time is less than an initial time and continuing to operate the electronic system by the battery for up to the initial time;

determining that a continuous abnormal condition in the alternating current power supply exists when the extraordinary time is greater than the initial time and continuing to operate the electronic system by the battery for up to an intermediate time;

stopping operation of the electronic system during a last time; and adjusting a length of the intermediate time based on the predicted life time.

20. The control method for an uninterruptible power supply of claim 18, wherein the predicting and updating step sets a shorter time than a present life time as a new life time.

21. The control method for an uninterruptible power supply of claim 19, wherein the step of adjusting the length of the intermediate time includes a step of reducing the length of the intermediate time based on a new predicted life time.

* * * * *